United States Patent
Xu

(10) Patent No.: US 12,426,483 B2
(45) Date of Patent: Sep. 23, 2025

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Feng Xu, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 17/758,061

(22) PCT Filed: Jun. 8, 2022

(86) PCT No.: PCT/CN2022/097670
§ 371 (c)(1),
(2) Date: Jun. 27, 2022

(87) PCT Pub. No.: WO2023/226090
PCT Pub. Date: Nov. 30, 2023

(65) Prior Publication Data
US 2024/0180005 A1  May 30, 2024

(30) Foreign Application Priority Data
May 27, 2022  (CN) ............ 202210593165.9

(51) Int. Cl.
*H10K 59/80* (2023.01)

(52) U.S. Cl.
CPC .................. *H10K 59/8791* (2023.02)

(58) Field of Classification Search
None
See application file for complete search history.

(56) References Cited

U.S. PATENT DOCUMENTS

2024/0180005 A1* 5/2024 Xu ............. H10K 59/8791

FOREIGN PATENT DOCUMENTS

| CN | 104220904 A | 12/2014 |
| CN | 112736120 A | 4/2021 |

(Continued)

OTHER PUBLICATIONS

International Search Report in International application No. PCT/CN2022/097670, mailed on Dec. 27, 2022.
(Continued)

*Primary Examiner* — Jack S Chen
(74) *Attorney, Agent, or Firm* — PV IP PC; Wei Te Chung

(57) ABSTRACT

A display panel and a display device including a functional region corresponding to a camera are provided. The display panel includes the panel main body, the polarization layer, and the backplate module. The polarization layer is disposed on the light-exiting side of the panel main body. The backplate module is disposed on the side of the panel main body away from the polarization layer. A part of the backplate module and the panel main body disposed in a stack and corresponding to the functional region have a total in-plane phase difference value, and the total in-plane phase difference value is less than 200 nanometers or greater than 7000 nanometers.

10 Claims, 3 Drawing Sheets

(56) References Cited

FOREIGN PATENT DOCUMENTS

| | | | |
|---|---|---|---|
| CN | 113593414 | A | 11/2021 |
| CN | 113920866 | A | 1/2022 |
| CN | 114495721 | A | 5/2022 |
| JP | 2020098351 | A | 6/2020 |
| WO | 2014021093 | A1 | 2/2014 |

OTHER PUBLICATIONS

Written Opinion of the International Search Authority in International application No. PCT/CN2022/097670, mailed on Dec. 28, 2022.
Chinese Office Action issued in corresponding Chinese Patent Application No. 202210593165.9 dated Apr. 30, 2025, pp. 1-6.

\* cited by examiner

DISPLAY PANEL AND DISPLAY DEVICE

BACKGROUND OF INVENTION

Field of Invention

The present application relates to the field of display technology, and specifically to a display panel and a display device.

Description of Prior Art

Current organic light emitting diode (OLED) panels are adapted to under-screen cameras, and light emitting diode (LED) panel include panel main bodies, polarizers disposed on the panel bodies, and backplate structures disposed under the panel main bodies.

In procedures of research and practice of the prior art, the inventor of the present application found that when general materials are adopted in the backplate structures, photos taken by the under-screen cameras have obvious rainbow stripes, which reduces quality of the photos.

SUMMARY OF INVENTION

Embodiments of the present application provide a display panel and a display device, which improve the situation that rainbow stripes appear in the photos during performing under-screen photography.

One embodiment of the present application provides a display panel, including a functional region and a display region enclosing at least a part of the functional region. The display panel includes:
 a panel main body;
 a polarization layer, wherein the polarization layer is disposed on a light-exiting side of the panel main body; and
 a backplate module, wherein the backplate module is disposed on a side of the panel main body away from the polarization layer.

A part of the backplate module and the panel main body disposed in a stack and corresponding to the functional region has a total in-plane phase difference value, and the total in-plane phase difference value is less than 200 nanometers or greater than 7000 nanometers.

Optionally, in some embodiments of the present application, an in-plane phase difference value of the part of the panel main body corresponding to the functional region is greater than or equal to 50 nanometers and less than or equal to 100 nanometers, and
 an in-plane phase difference value of a part of the backplate module corresponding to the functional region is less than 100 nanometers or greater than 6950 nanometers.

Optionally, in some embodiments of the present application, the backplate module includes a support layer, a buffer layer, a plurality of adhesive layers, and at least one flexible layer disposed in a stack; the buffer layer is located on the support layer; the at least one flexible layer is located on the buffer layer; the panel main body is located on the at least one flexible layer;
 one of the plurality of adhesive layers is attached between any two of the support layer, the buffer layer, and the at least one flexible layer;
 an opening corresponding to the functional region is defined in the backplate module, and the opening penetrates the support layer and the buffer layer.

Optionally, in some embodiments of the present application, a number of the flexible layer is one.

Optionally, in some embodiments of the present application, a number of the flexible layer is at least two, and the plurality of adhesive layers and the flexible layers are alternately disposed in a stack.

Optionally, in some embodiments of the present application, in-plane phase difference values of the at least two flexible layers are same.

Optionally, in some embodiments of the present application, difference of orientation directions of any two of the flexible layers is less than or equal to 15 degrees.

Optionally, in some embodiments of the present application, the orientation directions of the at least two of the flexible layers are parallel to each other.

Optionally, in some embodiments of the present application, the at least two flexible layers include a first flexible layer and a second flexible layer, the plurality of adhesive layers include a first adhesive layer, a second adhesive layer, and a third adhesive layer; the first adhesive layer is disposed between the support layer and the buffer layer, the second adhesive layer is disposed between the buffer layer and the first flexible layer, and the third adhesive layer is disposed between the first flexible layer and the second flexible layer.

Optionally, in some embodiments of the present application, a material of the flexible layer includes at least one of transparent polyimide, polyethylene terephthalate, triacetyl cellulose, or ultra-thin glass.

Optionally, in some embodiments of the present application, an in-plane phase difference value of the part of the panel main body corresponding to the functional region is greater than or equal to 50 nanometers and less than or equal to 100 nanometers, and an in-plane phase difference value of a part of the backplate module corresponding to the functional region is greater than or equal to 100 nanometers.

Correspondingly, one embodiment of the present application further provides a display device, including a camera and the display panel mentioned in any aforesaid embodiment. The display panel includes a functional region and a display region enclosing at least a part of the functional region, and the camera is disposed under the display panel and corresponds to the functional region.

Specifically, the display panel includes:
 a panel main body;
 a polarization layer, wherein the polarization layer is disposed on a light-exiting side of the panel main body; and
 a backplate module, wherein the backplate module is disposed on a side of the panel main body away from the polarization layer.

A part of the backplate module and the panel main body disposed in a stack and corresponding to the functional region has a total in-plane phase difference value, and the total in-plane phase difference value is less than 200 nanometers or greater than 7000 nanometers.

Optionally, in some embodiments of the present application, an in-plane phase difference value of the part of the panel main body corresponding to the functional region is greater than or equal to 50 nanometers and less than or equal to 100 nanometers, and
 an in-plane phase difference value of a part of the backplate module corresponding to the functional region is less than 100 nanometers or greater than 6950 nanometers.

Optionally, in some embodiments of the present application, the backplate module includes a support layer, a buffer layer, a plurality of adhesive layers, and at least one flexible layer disposed in a stack; the buffer layer is located on the support layer; the at least one flexible layer is located on the buffer layer; the panel main body is located on the at least one flexible layer;

One of the plurality of adhesive layers is attached between any two of the support layer, the buffer layer, and the at least one flexible layer;

an opening corresponding to the functional region is defined in the backplate module, and the opening penetrates the support layer and the buffer layer.

Optionally, in some embodiments of the present application, a number of the flexible layer is one.

Optionally, in some embodiments of the present application, a number of the flexible layer is at least two, and the plurality of adhesive layers and the flexible layers are alternately disposed in a stack.

Optionally, in some embodiments of the present application, in-plane phase difference values of the at least two flexible layers are same.

Optionally, in some embodiments of the present application, difference of orientation directions of any two of the flexible layers is less than or equal to 15 degrees.

Optionally, in some embodiments of the present application, the orientation directions of the at least two of the flexible layers are parallel to each other.

Optionally, in some embodiments of the present application, the at least two flexible layers comprise a first flexible layer and a second flexible layer, the plurality of adhesive layers comprise a first adhesive layer, a second adhesive layer, and a third adhesive layer; the first adhesive layer is disposed between the support layer and the buffer layer, the second adhesive layer is disposed between the buffer layer and the first flexible layer, and the third adhesive layer is disposed between the first flexible layer and the second flexible layer.

Optionally, in some embodiments of the present application, a material of the flexible layer includes at least one of transparent polyimide, polyethylene terephthalate, triacetyl cellulose, or ultra-thin glass.

Optionally, in some embodiments of the present application, an in-plane phase difference value of the part of the panel main body corresponding to the functional region is greater than or equal to 50 nanometers and less than or equal to 100 nanometers, and an in-plane phase difference value of a part of the backplate module corresponding to the functional region is greater than or equal to 100 nanometers.

The display panel and the display device of the embodiments of the present application include the functional region corresponding to the camera. The display panel includes the panel main body, the polarization layer, and the backplate module. The polarization layer is disposed on the light-exiting side of the panel main body. The backplate module is disposed on the side of the panel main body away from the polarization layer. A part of the backplate module and the panel main body disposed in a stack and corresponding to the functional region have a total in-plane phase difference value, and the total in-plane phase difference value is less than 200 nanometers or greater than 7000 nanometers.

The module structure under the polarization layer is adopted in the present application, i.e., configuration of the total in-plane phase difference value of the panel main body and the backplate module disposed in the stack and corresponding to the functional region being less than 200 nanometers or greater than 7000 nanometers, so that rainbow stripes in photos are remedied, thereby improving photo quality.

DESCRIPTION OF DRAWINGS

To more clearly illustrate embodiments or the technical solutions of the present application, the accompanying figures of the present application required for illustrating embodiments or the technical solutions of the present application will be described in brief. Obviously, the accompanying figures described below are only part of the embodiments of the present application, from which figures those skilled in the art can derive further figures without making any inventive efforts.

DETAILED DESCRIPTION OF EMBODIMENTS

Figure 1:
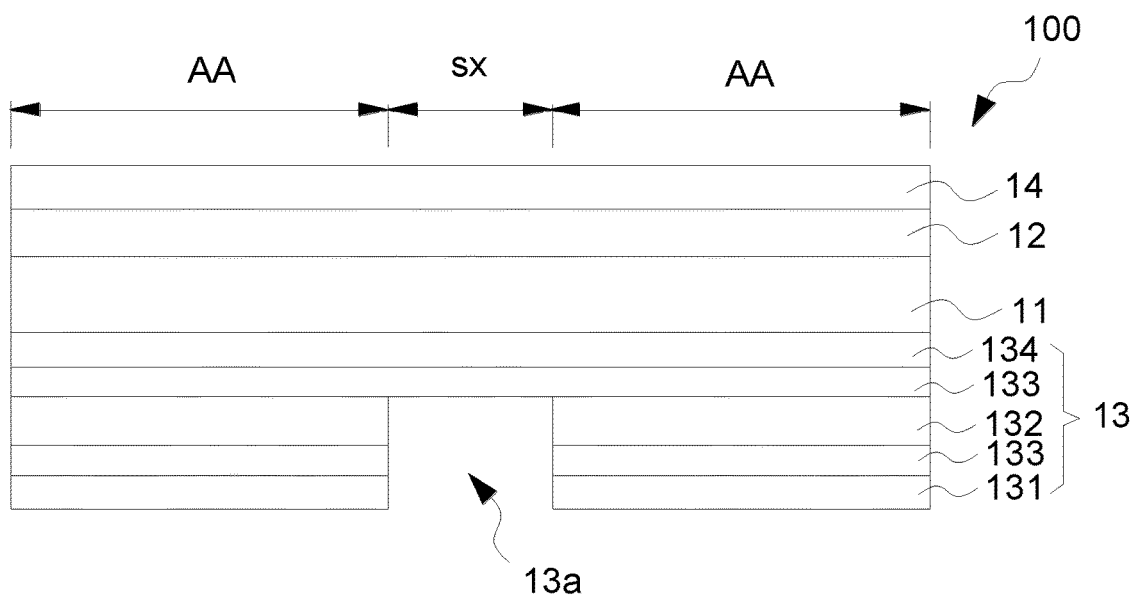
FIG. 1 is a structural schematic diagram of a display panel provided by a first embodiment of the present application.

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained by those skilled in the art based on the embodiments of the present application without creative efforts are within the scope of the present application. Besides, it should be understood that the specific embodiments described herein are merely for describing and explaining the present application and are not intended to limit the present application. In the present application, unless opposite stated, the orientation words used such as "upper" and "lower" generally refer to the upper and lower directions of the device in actual using or working state, and specifically refer to the drawing directions in the drawings, and "inner" and "outer" refer to the outline of the device.

Embodiments of the present application provide a display panel and a display device, and detailed descriptions are provided below. It should be noted that a description order of the following embodiments is not intended to limit a preferred order of the embodiments.

Please refer to FIG. 1. A first embodiment of the present application provides a display panel 100, including a functional region sx corresponding to an external camera and a display region AA enclosing at least a part of the functional region sx. The display panel 100 includes the panel main body 11, the polarization layer 12, and the backplate module 13.

The polarization layer 12 is disposed on the light-exiting side of the panel main body 11. The backplate module 13 is disposed on the side of the panel main body 11 away from the polarization layer 12.

A part of the backplate module 13 and the panel main body 11 disposed in a stack and corresponding to the functional region sx has a total in-plane phase difference value, and the total in-plane phase difference value is less than 200 nanometers or greater than 7000 nanometers.

The module structure under the polarization layer 12 is adopted in the display panel 100 provided by the first embodiment of the present application, i.e., configuration of the total in-plane phase difference value of the panel main body 11 and the backplate module 13 disposed in the stack and corresponding to the functional region sx being less than 200 nanometers or greater than 7000 nanometers, so that rainbow stripes in photos are remedies, thereby improving photo quality.

It should be noted that the total in-plane phase difference value can be a sum of in-plane phase difference values of each film layer and can also be less than the sum of the in-plane phase difference values of each film layer. The final total in-plane phase difference value is based on an actually measured value of a module composed of the panel main body 11 and the backplate module 13.

Optionally, the polarization layer 12 can be formed on the panel main body 11, and can also be attached to the panel main body 11 by an adhesive.

Optionally, the total in-plane phase difference value of the module composed of the panel main body 11 and the backplate module 13 that only corresponds to the functional region sx is less than 200 nanometers or greater than 7000 nanometers, or the total in-plane phase difference value of the entire module composed of the panel main body 11 and the backplate module 13 can also be less than 200 nanometers or greater than 7000 nanometers.

Optionally, the total in-plane phase difference value can be 190 nanometers, 150 nanometers, 100 nanometers, 50 nanometers, 0 nanometers, 7500 nanometers, 8500 nanometers, 9500 nanometers, 10000 nanometers or 15000 nanometers etc.

Optionally, the total in-plane phase difference value is less than or equal to 150 nanometers, or, greater than or equal to 8000 nanometers, e.g., 150 nanometers, 100 nanometers, 50 nanometers, 20 nanometers, 10 nanometers, 8000 nanometers, 9000 nanometers, 10000 nanometers, or 15000 nanometers, etc.

It should be noted that the in-plane phase difference value relates to production processes of the film layers. General film layers are formed by solution casting processes, and a film layer that is non-stretched, non-oriented can be obtained, while the film layer has no obvious orientation at this time. If the film layer is uniaxially or biaxially stretched, the film layer has an orientation direction, and the film layer with the orientation direction has an in-plane phase difference value at this time.

Optionally, the in-plane phase difference value of the part of the panel main body 11 corresponding to the functional region sx is greater than or equal to 50 nanometers and less than or equal to 100 nanometers, e.g., can be 50 nanometers, 60 nanometers, 70 nanometers, 80 nanometers, 90 nanometers, or 100 nanometers.

Optionally, the total in-plane phase difference value of the backplate module 13 corresponding to the part of the functional region sx is less than 100 nanometers or greater than 6950 nanometers, e.g., 30 nanometers, 50 nanometers, 60 nanometers, 70 nanometers, 80 nanometers, 90 nanometers, 7000 nanometers, 7500 nanometers, 8000 nanometers, 8500 nanometers, 9000 nanometers, or 10000 nanometers.

In some embodiments, in a precondition that the in-plane phase difference value of the part of the panel main body 11 corresponding to the functional region sx is greater than or equal to 50 nanometers and less than or equal to 100 nanometers, the in-plane phase difference of the part of the backplate module 13 corresponding to the functional region sx can be greater than or equal to 100 nanometers.

Therefore, if the orientation direction of the panel main body 11 is different from the orientation direction of the film layer in the back panel module 13 and the difference is large, e.g., the difference between the two directions is more than 15 degrees, an actual in-plane phase difference value of the entire module can be less than the in-plane phase difference value of the sum of the two.

In the first embodiment, the backplate module 13 includes a support layer 131, a buffer layer 132, a plurality of adhesive layers 133, and at least one flexible layer 134 disposed in a stack. The buffer layer 132 is located on the support layer 131. The at least one flexible layer 134 is located on the buffer layer 132. The panel main body 11 is located on the at least one flexible layer 134.

One adhesive layer 133 is attached between any two of the support layer 131, the buffer layer 132, and the at least one flexible layer 134.

An opening 13a corresponding to the functional region sx is further defined in the backplate module 13. The opening 13a penetrates the support layer 131 and the buffer layer 132.

Optionally, in the first embodiment, a number of the flexible layer 134 is one is taken as an example.

Optionally, the flexible layer 134 can be a single-layer film structure, or can be formed by stacking a plurality of sub-film layers.

Optionally, a material of the flexible layer 134 includes at least one of transparent polyimide (colorless polyimide, CPI), polyethylene terephthalate (PET), triacetyl cellulose (TAC), or ultra-thin glass (UTG). Of course, the flexible layer 134 can be made of other material, and redundant description will not be mentioned herein again.

Optionally, a thickness of the flexible layer 134 ranges from 25 microns to 200 microns, such as 25 microns, 50 microns, 100 microns, 150 microns, or 200 microns.

It should be noted that, the thickness of the flexible layer 134 can be configured according to requirements of actual situations. For example, when a bending radius r of the display panel 100 is 3 mm, the film layer is not damaged after being bent more than 200,000 times. Therefore, the thickness of the flexible layer 134 can be configured to range from 25 microns to 100 microns, e.g., 25 microns, 50 microns, 80 microns, or 100 microns.

Optionally, a thickness of the adhesive layers 133 ranges from 20 microns to 60 microns, e.g., 20 microns, 30 microns, 40 microns, 50 microns, or 60 microns.

Optionally, the adhesive layers 133 located on the flexible layer 134 are optical clear adhesive layers, which have a relative high light transmittance rate, e.g., its light transmittance rate is more than 80%.

Wherein, all the adhesive layers 133 can also be optically clear adhesive.

Optionally, the display panel 100 can further include a cover plate 14 disposed on the polarization layer 12. Optionally, an in-plane phase difference value of the cover plate 14 is 0, but is not limited thereto.

Figure 2:
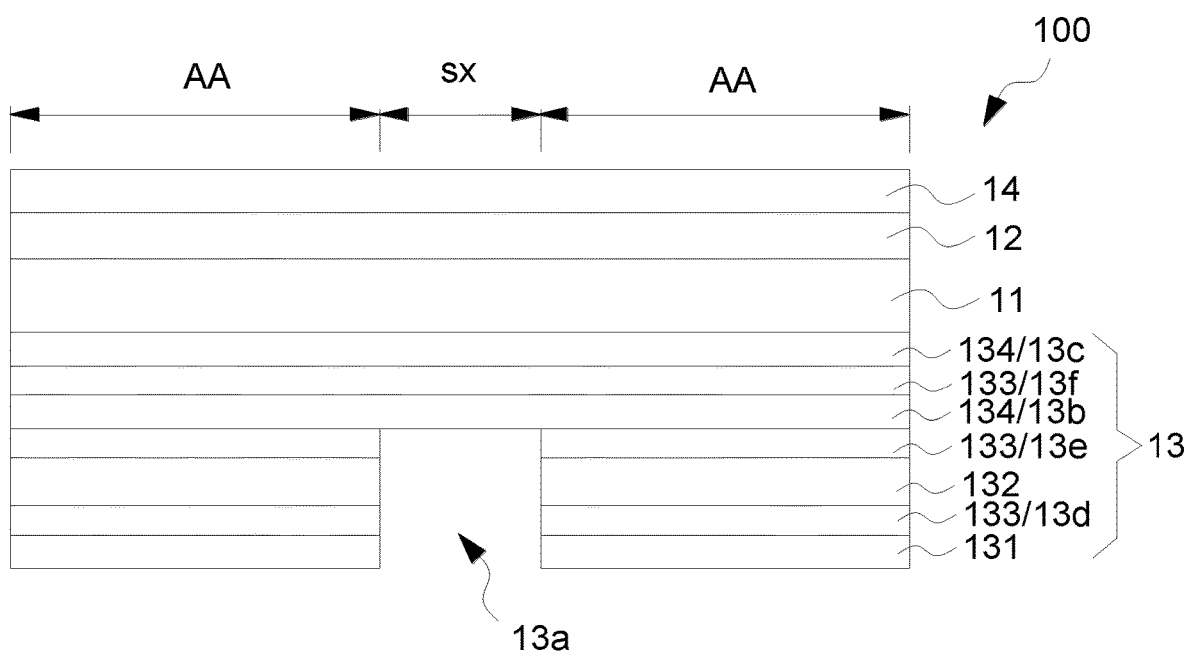
FIG. 2 is a structural schematic diagram of the display panel provided by a second embodiment of the present application.

Please refer to FIG. 2. Differences of the display panel 100 of a second embodiment and the display panel 100 of the first embodiment are that: a number of the flexible layer 134 is also at least two, and the adhesive layers 133 and the flexible layers 134 are alternately disposed in a stack.

Optionally, in-plane phase difference values of the at least two flexible layers 134 are same. The in-plane phase difference values of different flexible layers 134 being same is conducive to reducing complexity of optical effects and facilitates to remedying the rainbow stripes problem of cameras.

In some embodiments, the in-plane phase difference values of the at least two flexible layers 134 can also be different. For example, the in-plane phase difference value of one flexible layer 134 can be 0, and the in-plane phase difference value of another flexible layer 134 is greater than 0. When the in-plane phase difference value of the flexible 134 is 0, the flexible layer 134 has no obvious orientation direction.

Optionally, difference between the orientation directions of any two flexible layers 134 is less than or equal to 15 degrees. Wherein, the difference between the orientation directions of the two can be 15 degrees, 10 degrees, 5 degrees, or 0 degrees.

It should be noted that the orientation direction of the flexible layer 134 is a direction that the flexible layer is stretched. For example, the stretched direction of one flexible layer 134 is parallel to an x-axis of a two-dimensional coordinate system, and the stretched direction of another flexible layer 134 intersects with the x-axis; in this way, the angle of the deflected angle of the stretched direction of the other flexible layer 134 relative to the x-axis is the degree of the difference between the orientation directions of the two flexible layers.

In addition, when the two flexible layers are disposed in a stack, if the difference between the orientation directions of the two is less than or equal to 15 degrees, the total in-plane phase difference value of the two stacked flexible layers is greater than the in-plane phase difference value of any one of the flexible layers.

Therefore, the configuration of difference between the orientation directions of any two flexible layers 134 being less than or equal to 15 degrees is conducive to inferring trends of the total in-plane phase difference value, thereby improving production efficiency.

Optionally, the orientation directions of the at least two of the flexible layers 134 are parallel to each other. This configuration is conducive to improving the in-plane phase difference value.

Optionally, the flexible layers 134 include a first flexible layer 13b and a second flexible layer 13c. The adhesive layers include a first adhesive layer 13d, a second adhesive layer 13e, and a third adhesive layer 13f. The first adhesive layer 13d is disposed between the support layer 131 and the buffer layer 132. The second adhesive layer 13e is disposed between the buffer layer 132 and the first flexible layer 13b. The third adhesive layer 13f is disposed between the first flexible layer 13b and the second flexible layer 13c.

In the second embodiment, two flexible layers 134 and three adhesive layers 133 are taken as an example for description.

Wherein, orientation directions of the first flexible layer 13b and the second flexible layer 13c are parallel to each other. In-plane phase difference values of the first flexible layer 13b and the second flexible layer 13c are same.

Optionally, an in-plane phase difference value of the adhesive layer 133 is 0.

In some embodiments, the in-plane phase difference values of the first flexible layer 13b and the second flexible layer 13c can also be different. For example, the in-plane phase difference value of the first flexible layer 13b is 0 or 5, and the in-plane phase difference value of the second flexible layer 13c is 90 nanometers. Optionally, the first flexible layer 13b can be ultra-thin glass.

When the total in-plane phase difference value of the module composed of the panel main body 11 and the backplate module 13 is less than 200 nanometers, the first flexible layer 13b and the second flexible layer 13c are both flexible layers 134 with low phase difference values. For example, the in-plane phase difference values of the first flexible layer 13b and the second flexible layer 13c are less than 100 nanometers.

When the total in-plane phase difference value of the module composed of the panel main body 11 and the backplate module 13 is greater than 7000 nanometers, the first flexible layer 13b and the second flexible layer 13c are both flexible layers 134 with high phase difference values. For example, the in-plane phase difference values of the first flexible layer 13b and the second flexible layer 13c are both greater than 2000 nanometers.

Optionally, a material of the first flexible layer 13b and the second flexible layer 13c includes at least one of transparent polyimide (colorless polyimide, CPI), polyethylene terephthalate (PET), triacetyl cellulose (TAC), or ultra-thin glass (UTG). Of course, the two can be made of other material, and redundant description will not be mentioned herein again.

It should be noted that after film layers made of a same material undergoes different manufacturing processes, and different in-plane phase difference values can be obtained by configuring different film layers. For example, the film layer made of PET material can be a film layer with a low in-plane phase difference value or a film layer with a high in-plane phase difference value.

Figure 3:
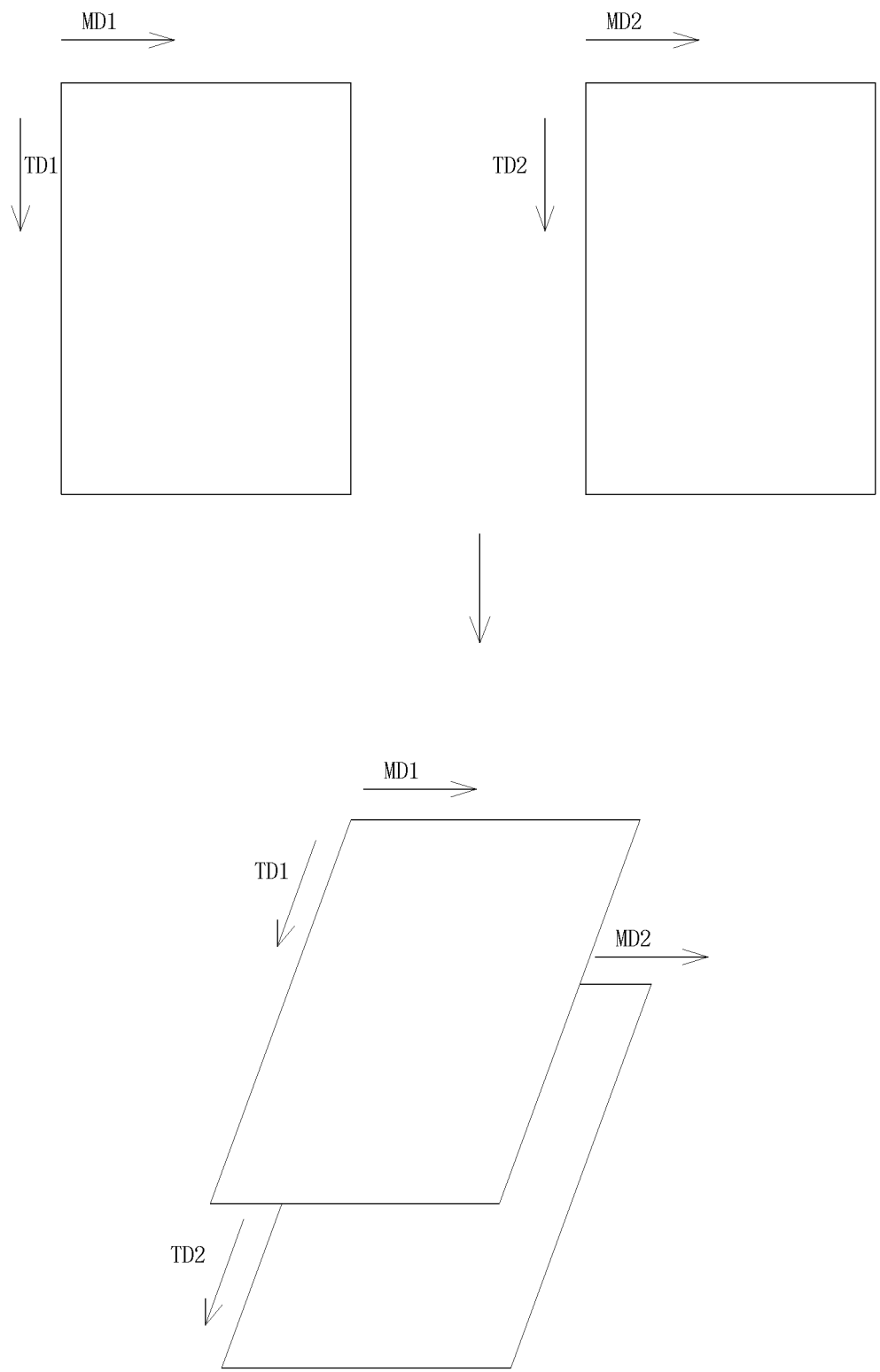
FIG. 3 is a schematic diagram of attachment of two film layers of one embodiment of the present application.

Wherein, as illustrated in FIG. 3, when the first flexible layer 13b and the second flexible layer 13c are attached, the orientation direction of the second flexible layer 13c and the orientation direction of the first flexible layer 13b are attached in a same direction.

The first flexible layer 13b has an orientation direction MD1 and a second direction TD1 perpendicular to the orientation direction MD1. The second flexible layer 13c has an orientation direction MD2 and a second direction TD2 perpendicular to the orientation direction MD2. Therefore, during attachment, the orientation direction MD1 of the first flexible layer 13b and the orientation direction MD2 of the second flexible layer 13c are attached in the same direction, and the second direction TD1 of the first flexible layer 13b and the second direction TD2 of the second flexible layer 13c are attached in the same direction. The attachment method is conducive to obtaining laminated film layers with a high in-plane phase value.

Figure 4:
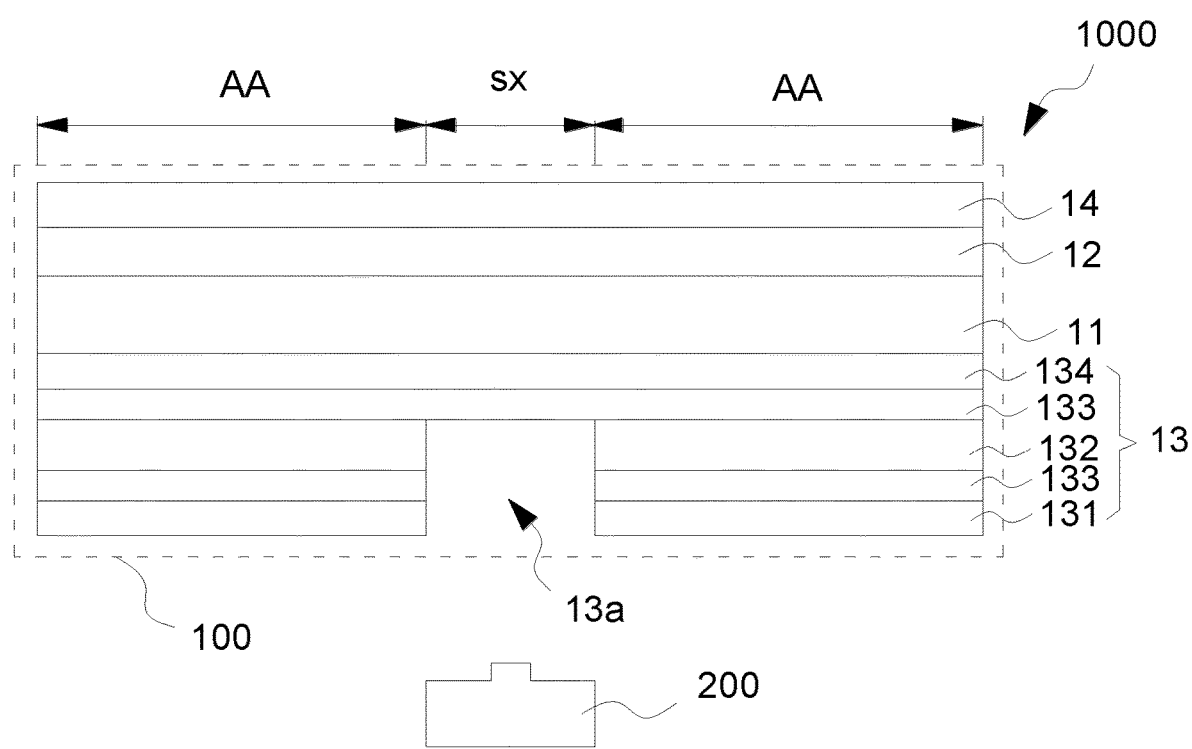
FIG. 4 is a structural schematic diagram of a display device provided by one embodiment of the present application.

Please refer to FIG. 4. Correspondingly, one embodiment of the present application further provides a display device 1000, which includes a camera 200 and the display panel 100 mentioned in any aforesaid embodiment. The camera 200 is disposed under the display panel 100 and corresponds to the functional region sx.

Wherein, the description of the display panel 100 please refer to the description of the aforesaid embodiments, the redundant description will not be mentioned herein again.

The display device 1000 of the embodiments of the present application includes the functional region sx corresponding to the camera 200. The display panel 100 includes the panel main body 11, the polarization layer 12, and the backplate module 13. The polarization layer 12 is disposed on the light-exiting side of the panel main body 11. The backplate module 13 is disposed on the side of the panel main body 11 away from the polarization layer 12. A part of the backplate module 13 and the panel main body 11 disposed in a stack and corresponding to the functional region sx has a total in-plane phase difference value, and the total in-plane phase difference value is less than 200 nanometers or greater than 7000 nanometers.

The module structure under the polarization layer 12 is adopted in the present application, i.e., configuration of the total in-plane phase difference value of the panel main body and the backplate module disposed in the stack and corresponding to the functional region sx being less than 200 nanometers or greater than 7000 nanometers, so that rainbow stripes in photos are remedied, thereby improving photo quality.

The display panel and the display device provided by the embodiments of the present application are described in detail. This article uses specific cases for describing the principles and the embodiments of the present application, and the description of the embodiments mentioned above is only for helping to understand the method and the core idea of the present application. Meanwhile, for those skilled in the art, will have various changes in specific embodiments and application scopes according to the idea of the present disclosure. In summary, the content of the specification should not be understood as limit to the present application.

What is claimed is:

1. A display panel, comprising a functional region and a display region enclosing at least a part of the functional region, wherein the display panel comprises:
   a panel main body;
   a polarization layer, wherein the polarization layer is disposed on a light-exiting side of the panel main body;
   a backplate module, wherein the backplate module is disposed on a side of the panel main body away from the polarization layer; and
   wherein a part of the backplate module and the panel main body disposed in a stack and corresponding to the functional region has a total in-plane phase difference value, and the total in-plane phase difference value is less than 200 nanometers or greater than 7000 nanometers.

2. The display panel as claimed in claim 1, wherein the backplate module comprises a support layer, a buffer layer, a plurality of adhesive layers, and at least one flexible layer disposed in a stack; the buffer layer is located on the support layer; the at least one flexible layer is located on the buffer layer; the panel main body is located on the at least one flexible layer;
   One of the plurality of adhesive layers is attached between any two of the support layer, the buffer layer, and the at least one flexible layer;
   an opening corresponding to the functional region is defined in the backplate module, and the opening penetrates the support layer and the buffer layer.

3. The display panel as claimed in claim 2, wherein a number of the flexible layer is one.

4. The display panel as claimed in claim 2, wherein a number of the flexible layer is at least two, and the plurality of adhesive layers and the flexible layers are alternately disposed in a stack.

5. The display panel as claimed in claim 4, wherein in-plane phase difference values of the at least two flexible layers are same.

6. The display panel as claimed in claim 4, wherein difference of orientation directions of any two of the flexible layers is less than or equal to 15 degrees.

7. The display panel as claimed in claim 6, wherein the orientation directions of the at least two of the flexible layers are parallel to each other.

8. The display panel as claimed in claim 4, wherein the at least two flexible layers comprise a first flexible layer and a second flexible layer, the plurality of adhesive layers comprise a first adhesive layer, a second adhesive layer, and a third adhesive layer, the first adhesive layer is disposed between the support layer and the buffer layer, the second adhesive layer is disposed between the buffer layer and the first flexible layer, and the third adhesive layer is disposed between the first flexible layer and the second flexible layer.

9. The display panel as claimed in claim 1, wherein an in-plane phase difference value of the part of the panel main body corresponding to the functional region is greater than or equal to 50 nanometers and less than or equal to 100 nanometers, and
   an in-plane phase difference value of a part of the backplate module corresponding to the functional region is less than 100 nanometers or greater than 6950 nanometers.

10. The display panel as claimed in claim 1, wherein an in-plane phase difference value of the part of the panel main body corresponding to the functional region is greater than or equal to 50 nanometers and less than or equal to 100 nanometers, and an in-plane phase difference value of a part of the backplate module corresponding to the functional region is greater than or equal to 100 nanometers.

* * * * *